(12) United States Patent
Xu et al.

(10) Patent No.: US 7,727,817 B2
(45) Date of Patent: Jun. 1, 2010

(54) SEMICONDUCTOR INTEGRATED CIRCUIT PACKAGE AND METHOD OF PACKAGING SEMICONDUCTOR INTEGRATED CIRCUIT

(75) Inventors: Xuesong Xu, Tianjin (CN); Nan Xu, Tianjin (CN); Jinzhong Yao, Tianjin (CN)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/403,400

(22) Filed: Mar. 13, 2009

(65) Prior Publication Data
US 2009/0236713 A1  Sep. 24, 2009

(30) Foreign Application Priority Data
Mar. 19, 2008  (CN) .................... 2008 1 0087126

(51) Int. Cl.
*H01L 21/44* (2006.01)
*H01L 21/48* (2006.01)
(52) U.S. Cl. .............. 438/123; 438/106; 438/124; 257/666; 257/676
(58) Field of Classification Search ............ 438/106, 438/121, 123–125; 257/666, 676, E21.506, 257/E21.504, E23.031, E23.116
See application file for complete search history.

(56) References Cited

U.S. PATENT DOCUMENTS

| 6,544,816 | B1 | 4/2003 | Lim et al. |
| 6,646,335 | B2 * | 11/2003 | Emoto .................... 257/686 |
| 6,746,895 | B2 | 6/2004 | Bolken et al. |
| 2002/0041911 | A1 | 4/2002 | Mine |
| 2005/0263873 | A1 * | 12/2005 | Shoji .................... 257/698 |

* cited by examiner

*Primary Examiner*—Theresa T Doan
(74) *Attorney, Agent, or Firm*—Charles Bergere

(57) ABSTRACT

In a method of packaging a semiconductor IC, a tape is attached to a back surface of a lead frame array, and the lead frame array is held between an upper mold chase and a lower mold chase of a mold, with the back surface of the lead frame array upward. The upper and lower mold chases form an upper cavity and a lower cavity with respect to the lead frame array respectively. A mold compound is injected into the upper and lower cavities respectively. With respect to clearances between leads, between die pads and/or between the leads and the die pads, the mold compound injected into the upper cavity covers the portion of the tape over the clearances before the mold compound injected into the lower cavity fills the clearances, so that the tape is depressed. After curing the mold compound, removing the mold and de-taping, the mold compound filled in the clearances is recessed inward from the back surface, which increases the solderability in the subsequent surface mount process and decreases the possibility of the occurrence of lead short-circuits.

6 Claims, 4 Drawing Sheets

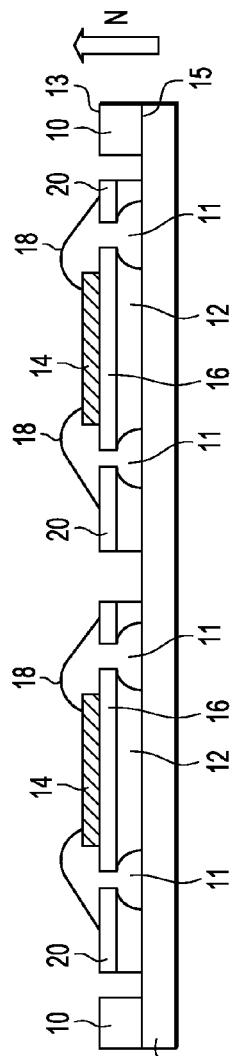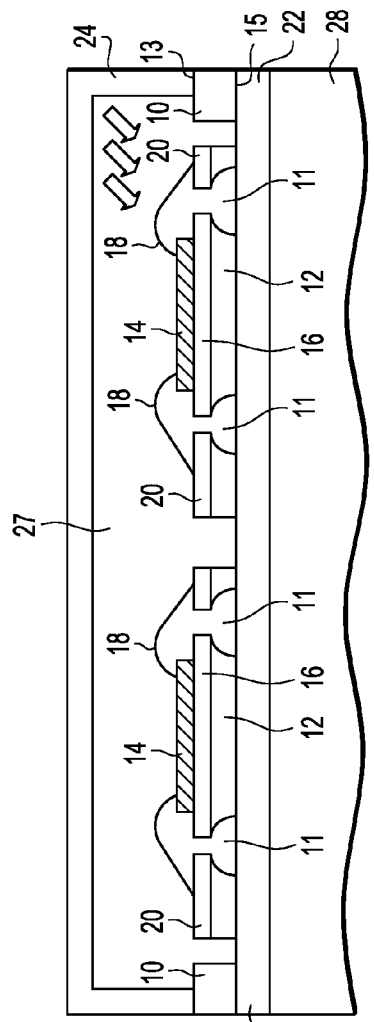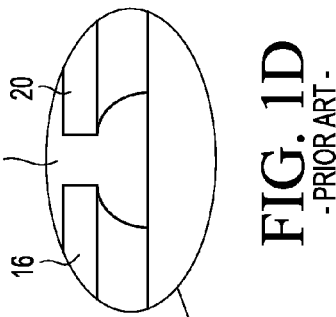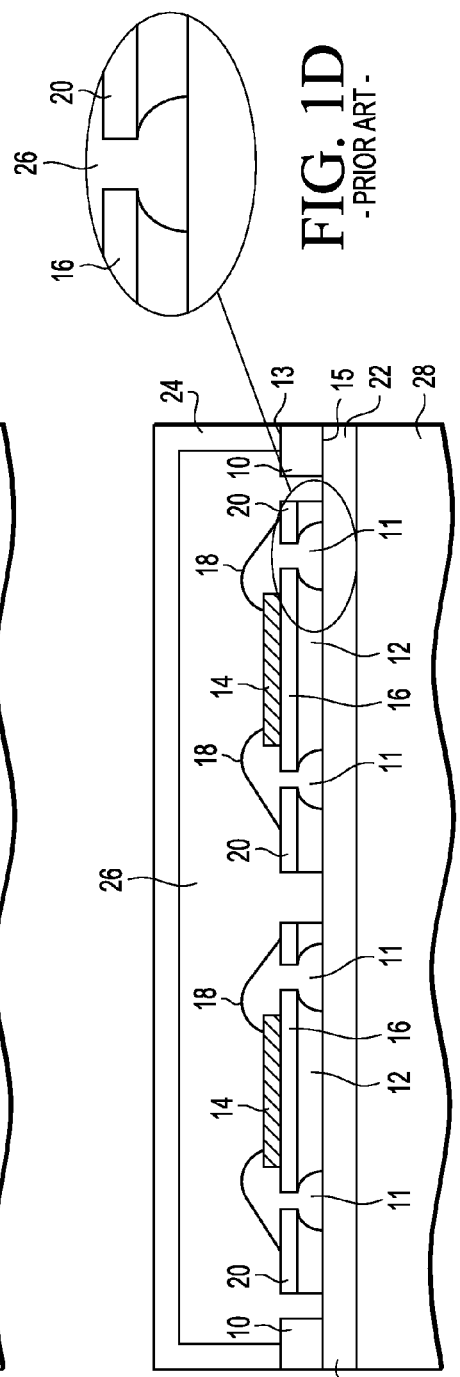

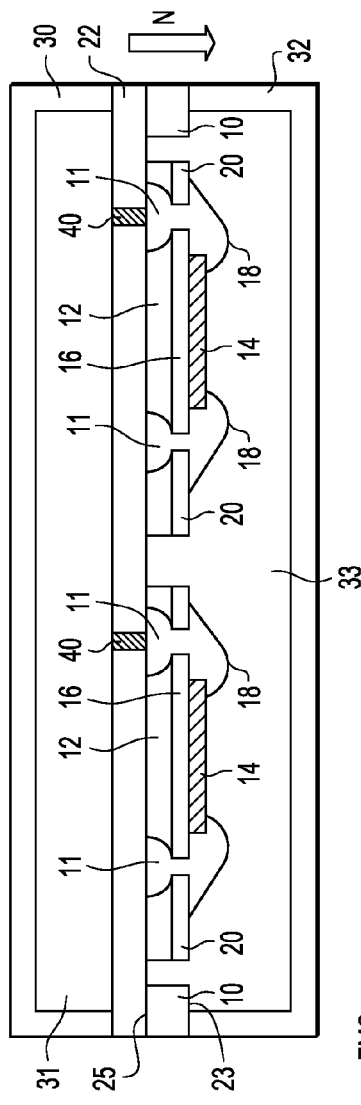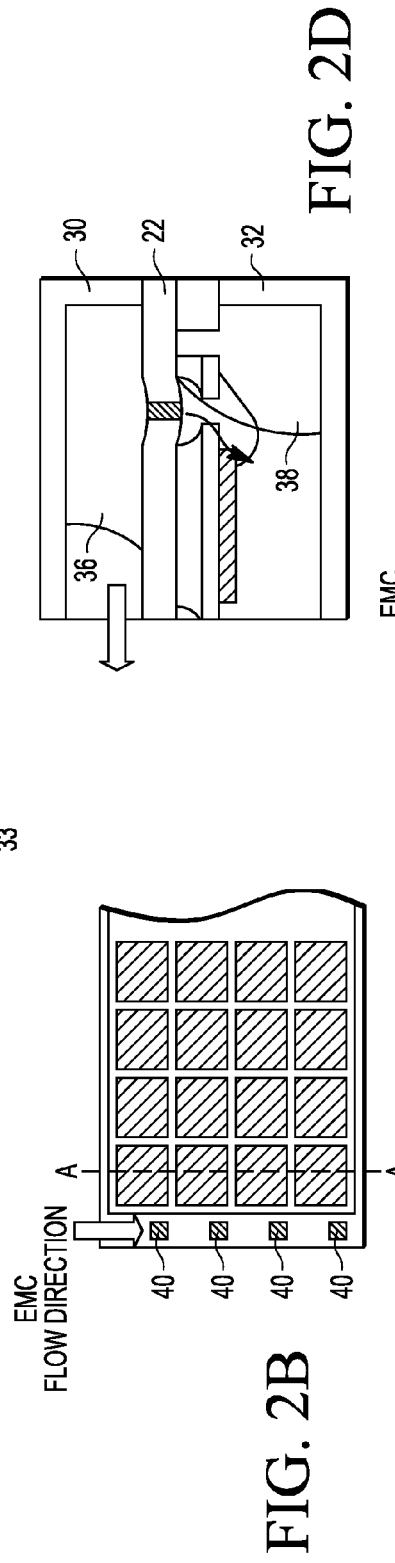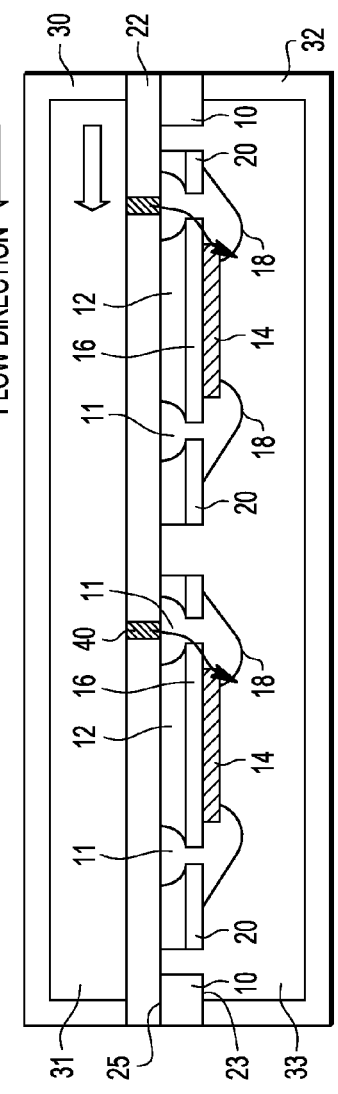
FIG. 2A
FIG. 2B
FIG. 2C
FIG. 2D

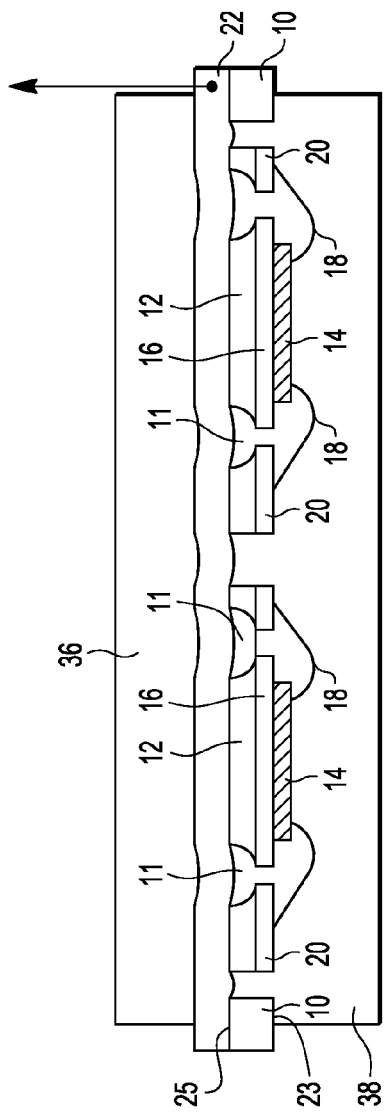
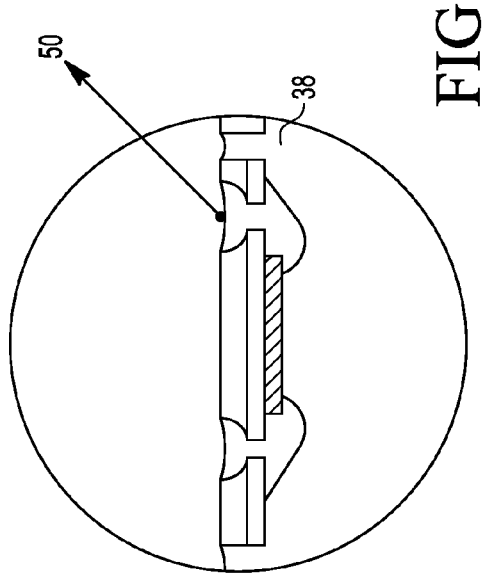
FIG. 3A
FIG. 3B

SEMICONDUCTOR INTEGRATED CIRCUIT PACKAGE AND METHOD OF PACKAGING SEMICONDUCTOR INTEGRATED CIRCUIT

FIELD OF THE INVENTION

The present invention relates in general to semiconductor integrated circuits (ICs), and more particularly to a semiconductor integrated circuit package and a method of packaging a semiconductor integrated circuit.

BACKGROUND OF THE INVENTION

At present, a lead frame is often used to provide a semiconductor chip with electrical interconnection. That is, the chip is attached to die pad of the lead frame, and then the pads on the semiconductor chip are electrically connected to leads of the lead frame using wires by way of a wire bonding technique. Thereafter, an integrated circuit comprising a semiconductor chip, a lead frame and wires is packaged using mold compound. Exposed areas of the leads are used for providing electrical interconnection from the outside to the semiconductor chip.

In order to provide good electrical interconnection with other devices, a portion of the leads must be fully exposed. If the lead area is covered with mold compound, or not fully exposed or not easily contactable, a solderability problem of the leads and a printed circuit board (PCB), for example, may arise.

In the IC package application, it has been found that, due to a lower lead stand-off or even the lack of the lead stand-off in a Quad Flat No-lead (QFN) or Power Quad Flat No-lead (PQFN) package, some circuit board level problems tend to occur, for example, the solderability is poor, and particularly, a lead short-circuit or the like is liable to occur. Increasing the lead stand-off (a projected portion of the leads with respect to the mold compound in the periphery of the leads) would be helpful for resolving the above problem.

First, referring to FIGS. 1A-1D, a conventional mold compound packaging method is described. FIGS. 1A-1D are cross-sectional views showing the current mold compound packaging process using a single-cavity mold.

FIG. 1A shows a cross-sectional view of a beforehand prepared lead frame array in which semiconductor chips 14 have been mounted and interconnects between the semiconductor chips 14 and leads 20 are performed by wires 18. The lead frame array comprises one or more lead frames 10. For convenience, FIG. 1A only schematically shows two lead frames 10, which however is not a limit in practice.

Each lead frame 10 has leads 20 and die pads 16. After the leads 20 and the die pads 16 on the lead frame 10 are formed by full-etch, edge portions of the leads 20 and/or the die pads 16 are usually further half-etched from a back surface 15 of the lead frame to form half-etched portions 12, thereby causing clearances 11 between the leads 20 and/or the die pads 16 to have an increased size on the back surface 15.

FIGS. 1A-1D only show the clearances 11 between the leads 20 and the die pads 16, but a person skilled in the art should understand that there may also exist clearances 11 between the leads 20 and between the die pads 16 (provided that a plurality of the die pads 16 are provided on one lead frame 10).

On a front surface 13 (an upper surface shown in FIG. 1A) of a lead frame array, the semiconductor chips 14 are attached to the corresponding die pads 16 respectively, and pads on the semiconductor chips 14 and the corresponding leads 20 of the lead frame 10 are connected by the wires 18.

A tape 22 is attached to the back surface 15 of the lead frame array, whereby the lead frame array structure as shown in FIG. 1A is formed, so as to be loaded into a mold for mold compound packaging.

FIG. 1B shows a process of packaging the lead frame array structure of FIG. 1A using the conventional mold compound packaging method. As shown in FIG. 1B, the currently employed mold has a single cavity 27. In the single-cavity mold, the lead frame array structure shown in FIG. 1A is disposed in a cavity 27 formed between a lower support table 28 and an upper mold chase 24 of the mold, with the front surface 13 thereof upward (a lead frame normal direction N being upward). A flow of mold compound 26 is injected into the cavity 27, until the cavity 27 is filled with the mold compound 26, thereby forming a structure as shown in FIG. 1C. As an example, the mold compound may be an epoxy mold compound (EMC).

After curing the mold compound 26 in the cavity, the lead frame array is taken out of the mold. Then, the tape 22 is removed, and a dicing/cutting process is performed.

FIG. 1D shows a partially enlarged view of the clearances 11 between the leads 20 and the die pads 16 in the structure shown in FIG. 1C. As shown in FIG. 1D, in the semiconductor IC package obtained using the conventional packaging method, the leads 20 and the die pads 16 are at substantially the same height as the mold compound 26 in the clearances 11 therebetween, thereby forming a substantially planar surface, that is, no lead stand-off is produced.

Due to the absence of lead stand-offs, the back surface 15 of the lead frame is planar. During surface mounting (attaching the packaged IC to a PCZB), it is impossible to provide a channel for redundant solder paste to smoothly flow out, and thus the redundant solder paste extends into the clearances 11 between the leads 20 and/or the die pads 16. As a result, a possibility of short-circuit between adjacent leads 20 and/or die pads 16 is increased due to the redundant solder paste.

Some methods, such as a thicker plating method and an epoxy bumping method, have been taken into consideration for solving the above problem, but these methods bring about some other problems.

In the so-called thicker plating method, a semiconductor IC package, after being formed, is thicker plated; meaning the mold compound portions are not plated, whereas additional plating is added to the lead and die pad portions to form a thicker plated layer, thereby forming a lead stand-off. However, this method has the following problems: a long plating time results in a very low UPH (Units Per Hour) in the plating process; the thicker plating process is difficult to control; in a dicing/cutting process, it is hard to perform alignment using calibration points set on the back surface of the lead frame due to the existence of the thicker plating layer; also, there exists a higher risk of whisker growing. Further, the stand-off obtained by means of the thicker plating method does not have a great height.

In the so-called epoxy bumping method, epoxy bumps are set on the back surface of the lead frame using an adhesive injection method to leave space between the lead frame and the printed circuit board, thereby causing redundant solder paste to flow out during the surface mounting process. However, in this method, besides the difficulty of controlling the co-planarity of bumps, additional equipment costs for setting epoxy bumps are increased.

In view of the above situations, there is a need for a solution that can increase lead stand-off to solve the above problems such as poor solderability, and particularly lead short-circuit, without causing a great increase of process costs.

The following are some currently existing prior-art documents in which packaging is carried out using a dual-cavity mold, but which are different from the present invention. U.S. Patent Application Publication No. US2002/0041911A1 discloses a resin encapsulation mold, which comprises an upper mold chase and a lower mold chase that form recessed portions respectively to receive a semiconductor device, and which avoids the development of air bubbles near ejection pins by adjusting the amount of protrusion of the ejection pins ejected from bottoms of the upper and lower mold clamps respectively. U.S. Pat. No. 6,746,895 discloses a method for encapsulating a multi-chip substrate array. In this method, a mold comprising an upper mold chase and a lower mold chase is used, wherein the upper mold chase has a cavity for encapsulating interconnections on a first side of a multi-chip carrier substrate, and the lower mold chase has a cavity for encapsulating the entire second side of the multi-chip carrier substrate, on which a plurality IC chips are formed. U.S. Pat. No. 6,544,816B1 discloses a method of encapsulating thin semiconductor chip-scale packages, in which upper and lower halves of a mold together form one cavity.

SUMMARY OF THE INVENTION

The technical problem to be solved by the present invention is to provide a method of packaging a semiconductor integrated circuit (IC) using mold compound, a mold for the mold compound packaging method and a semiconductor IC package with a great lead stand-off, which can increase lead stand-off without significantly increasing process costs.

According to one aspect of the present invention, there is provided a method of packaging a semiconductor integrated circuit with a mold compound using a dual-cavity mold. The method includes the steps of providing a lead frame array having a front surface and a back surface opposite to the front surface, each lead frame in the lead frame array including leads and die pads. On the front surface of the lead frame, semiconductor chips are attached to corresponding die pads respectively, and pads on the semiconductor chips and corresponding leads of the lead frame are connected by wires. A tape is attached to the back surface of the lead frame array. The lead frame array is held between an upper mold chase and a lower mold chase of a mold, with the back surface of the lead frame array upward, the upper mold chase and the lower mold chase forming an upper cavity and a lower cavity with respect to the lead frame array respectively. The mold compound is injected into the upper cavity and the lower cavity respectively, wherein with respect to clearances between the leads, between the die pads and/or between the leads and the die pads, the mold compound injected into the upper cavity covers the portion of the tape over the clearances before the mold compound injected into the lower cavity fills the clearances, so that the tape is depressed. The mold compound is cured after the mold is filled with the mold compound, then the mold is removed. Finally the tape is removed from the back surface of the lead frame array.

In one embodiment, injecting the mold compound into the lower cavity may be realized by branching a portion of the mold compound injected into the upper cavity and into the lower cavity. Preferably, a velocity of a flow of the mold compound injected into the upper cavity is greater than a velocity of a flow of the mold compound injected into the lower cavity. Preferably, the injection of the mold compound into the lower cavity is initiated after the injection of the mold compound into the upper cavity is initiated, and the injection of the mold compound into the lower cavity may even be initiated after the upper cavity is filled with the mold compound.

In one embodiment, edge portions of the leads and/or the die pads are half-etched on the back surface of the lead frame array, such that the clearances have larger sizes on the back surface than on the front surface.

According to a further aspect of the present invention, there is provided a dual-cavity mold for the above-mentioned packaging method with mold compound. The mold includes an upper mold chase and a lower mold chase which form, with respect to a lead frame array, an upper cavity and a lower cavity respectively. The lower cavity is configured to receive semiconductor chips and wires. The upper mold chase and the lower mold chase are configured to be capable of injecting the mold compound into the upper cavity and the lower cavity respectively, and with respect to clearances between the leads, between the die pads and/or between the leads and the die pads, the mold compound injected into the upper cavity covers the portion of a tape over the clearances before the mold compound injected into the lower cavity fills the clearances, so that the tape is depressed.

The lower mold chase and the upper mold chase are configured to enable the lower cavity and the upper cavity to be liquid communicating at an edge of the mold, so that the mold compound injected into the upper cavity from the outside can be branched into the lower cavity.

According to a further aspect of the present invention, there is provided a semiconductor integrated circuit (IC) package. The semiconductor IC package comprises a lead frame, semiconductor chips and wires. The lead frame has a front surface and a back surface opposite to the front surface and includes leads and die pads. On the front surface, the semiconductor chips are attached to corresponding die pads respectively, and pads on the semiconductor chips and corresponding leads of the lead frame being connected by the wires. The semiconductor chips, the wires and the lead frame are covered by mold compound, while leaving the back surface of the lead frame uncovered by the mold compound. The clearances between the leads, between the die pads and/or between the leads and the die pads are filled with the mold compound. The mold compound filled in the clearances is recessed inward from the back surface of the lead frame.

According to the present invention, the mold compound in the upper cavity that first reaches the clearances depresses the tape, such that the mold compound in the lower cavity that is filled in the clearances has a recessed surface. The mold compound filled in the clearances is recessed inward from the back surface of the lead frame, whereby the lead stand-off is significantly increased, thereby solving the above problems such as the poor solderability and the occurrence of lead short-circuit.

When the semiconductor IC package according to the present invention is mounted on a printed circuit board (PCB) through a surface mount process, redundant solder paste may easily flow out from a channel formed by the inwardly recessed portion of the mold compound. Even if part of the redundant solder paste does not flow out but extends along mold compound surfaces between the leads, between the die pads, and between the leads and the die pads, since a surface area of a curved surface is much greater than that of a traditional planar surface, the solder paste needs to extend a longer distance from both sides of the clearances between the leads, between the die pads, and between the leads and the die pads thereby to contact each other and cause lead short-circuit, and as a result, the possibility of the lead short-circuit is also reduced.

Unlike the above-described thicker plating method, the present invention does not increase directly the height (lead stand-off) of the leads (and/or the die pads), but achieves indirectly the effect of increasing the height (lead stand-off) of the leads (and/or the die pads) by lowering the mold compound around the leads (and/or the die pads) and making the mold compound recessed inward. Compared with the thicker plating method, the present invention may obtain a greater lead stand-off.

Further, the packaging method of the present invention makes little change in process and this stable process control of the molding process can be achieved.

BRIEF DESCRIPTION OF THE DRAWINGS

FIGS. 1A-1D are cross-sectional views showing a prior-art mold compound packaging process using a single-cavity mold;

FIGS. 2A-2D show a mold compound packaging process using a dual-cavity mold in accordance with an embodiment of the present invention;

FIG. 3A shows a structure removed from the mold, and FIG. 3B shows a partially enlarged view of a de-taped structure.

DETAILED DESCRIPTION OF THE PRESENT INVENTION

Figure 4B:
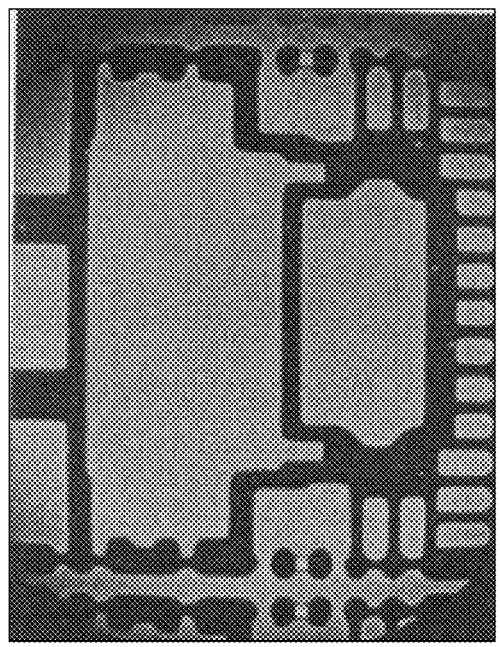
FIGS. 4A and 4B are photographs of a bottom surface of a semiconductor IC package obtained according to the present invention and a bottom surface of a semiconductor IC package obtained according to the prior art, respectively.

The present invention will now be described in detail with reference to the drawings. FIG. 2A shows a dual-cavity mold according to the present invention and a lead frame array held therein. The dual-cavity mold has an upper mold chase 30 and a lower mold chase 32 that form two cavities.

The lead frame array used here is the same as the foregoing lead frame array described with reference to FIG. 1A. The beforehand prepared lead frame array includes one or more lead frames 10. Each lead frame 10 has leads 20 and die pads 16. After the leads 20 and the die pads 16 on the lead frame are formed by full-etch, edge portions of the leads 20 and/or the die pads 16 are usually further half-etched from a back surface 25 of the lead frame 10 to form half-etched portions 12, thereby causing clearances 11 between the leads 20 and/or the die pads 16 to have an increased size on the back surface 25.

FIGS. 2A-2D and FIGS. 3A and 3B only show the clearances 11 between the leads 20 and the die pads 16, but a person skilled in the art should understand that, there may also exist clearances 11 between the leads 20 and between the die pads 16 (if one lead frame 10 is provided with a plurality of die pads 16). The packaging method of the present invention will have the same effect for these clearances 11.

On a front surface 23 (a lower surface in FIG. 2A) of the lead frame 10, semiconductor chips 14 are attached to corresponding die pads 16 respectively, and pads on the semiconductor chips 14 and corresponding leads 20 of the lead frame 10 are connected by wires 18.

A tape 22 is attached to the back surface 25 of the lead frame array. Then the lead frame array is held between the upper mold chase 30 and the lower mold chase 32 of the mold, with the back surface 25 of the lead frame array upward (a lead frame normal direction N being downward), the upper mold chase 30 and the lower mold chase 32 forming an upper cavity 31 and a lower cavity 33 with respect to the lead frame array respectively such that the wires 18 and the semiconductor chips 14 mounted on the front surface 23 of the lead frame array are received in the lower cavity 33. The lead frame array to which the tape 22 is attached separates the upper cavity 31 of the mold from the upper cavity 33 thereof.

FIG. 2B is a schematic top view of the packaging process after the lead frame array is loaded, and in this figure, the upper mold chase 30 is removed. FIG. 2A may be considered as a cross-sectional view that is taken along line A-A in FIG. 2B. Although four lead frames are drawn along the line A-A in FIG. 2B and FIG. 2A only shows two lead frames, this is only for the sake of convenience and is not meant to limit the invention in anyway.

As shown in FIG. 2B, it is possible to configure the mold (the upper mold chase and the lower mold clamp), for example, an opening 40 is arranged at an edge of the mold, thereby to cause the upper and lower cavities to be liquid-communicating, so that the mold compound injected into the upper cavity 31 from the outside can be branched into the lower cavity 33. Thus, by only injecting the mold compound into the upper cavity 31, both the upper cavity 31 and the lower cavity 33 can be filled with the mold compound. As a matter of course, it is absolutely possible to arrange mold compound injection ports (not shown in FIG. 2B) for the upper cavity 31 and the lower cavity 33 respectively thereby to inject the mold compound into the two cavities respectively.

As shown in FIGS. 2A and 2B, it is possible to provide an opening 40 for lead frames at each row respectively. FIG. 2A also correspondingly shows the opening 40, but the opening 40 is not on the section shown in FIG. 2A (the line A-A in FIG. 2B). For the convenience in drawing only, these figures show that the opening 40 overlaps the clearance 11 between the lead 20 and the die pad 16, but in the actual model design, the position of the opening 40 does not need to have such association with the position of the clearance 11.

After the lead frame array is loaded into the dual-cavity model, as shown in FIG. 2C, the mold compound is injected into the upper cavity 31. The mold compound injected into the upper cavity 31, while flowing in the upper cavity 31, flows into the lower cavity 33 through the opening arranged at an edge of the cavity so as to fill the lower cavity 33.

The two cavities of the mold divide the mold compound so that the mold compound flows in the upper cavity 31 over the tape 22 and in the lower cavity 33 under the tape 22 respectively. With respect to the clearances 11 between the leads 20, between the die pads 16 and/or between the leads 20 and the die pads 16, the mold compound 36 injected into the upper cavity 31 covers the portion of the tape 22 over the clearances 11 before the mold compound 38 injected into the lower cavity 33 fills the clearances 11, so that the tape 22 is depressed, as shown in the partially enlarged view of FIG. 2D.

This can be realized by using the following fact: due to the existence of the semiconductor chips 14 and the wires 18 on the front surface 23 of the lead frame that are received in the lower cavity 33 and of the clearances 11, etc., the mold compound 38 injected into the lower cavity 33 has a slower flow velocity than the mold compound 36 injected into the upper cavity 31.

It is further possible to first initiate injection of the mold compound 36 into the upper cavity 31 and then initiate injection of the mold compound 38 into the lower cavity 33. This can further ensure the mold compound 36 in the upper cavity 31 to first reach the clearances 11. This can further increase the time during which the mold compound 36 in the upper cavity 31 applies pressure to the tape 22 over the clearances 11, thereby increasing a recessed degree of the tape 22.

In fact, in the case where the mold as shown in FIGS. 2A and 2B of the present invention is used, since the mold compound 38 in the lower cavity 33 is injected there into by branching the mold compound 36 injected into the upper cavity 31 via the opening 40, the injection of the mold compound 38 into the lower cavity 33 is initiated later than the time when the injection of the mold compound 36 into the upper cavity 31 is initiated.

In the event that injection ports are arranged for the upper cavity 31 and the lower cavity 33 respectively for the respective injection of the mold compound, it is possible to control a timing at which the injection of the mold compound is initiated through the mold compound injection ports for the upper cavity 31 and the lower cavity 33.

Further, it is also possible to first inject the mold compound 36 into the upper cavity 31 until the upper cavity 31 is fully filled with the mold compound 36, and then initiates the injection of the mold compound 38 into the lower cavity 33.

FIG. 2D shows a partially enlarged cross-sectional view of the packaging process after the mold compound is partially injected into the mold. The mold compound 36 injected into the upper cavity 31 flows along the tape 22 that is attached to the back surface 25 of the lead frame array. Meanwhile, the mold compound is branched from the upper cavity into the lower cavity 33 through the opening arranged at the edge of the mold and flows in the lower cavity 33. With respect to the clearances 11 as shown in FIG. 2D, the mold compound 36 in the upper cavity 31 covers the tape 22 over the clearances 11 before the mold compound 38 in the lower cavity 33 flows into the clearances 11, so that the tape 22 over the clearances 11 is depressed, leaving a recessed space for the mold compound 38 in the lower cavity 33.

After both the upper cavity 31 and the lower cavity 33 are filled with the mold compound, the mold compound is cured. Then the mold is removed, that is to say, the lead frame array that has been packaged using the mold compound is taken out from the mold.

FIG. 3A shows a structure taken out from the mold. Then the tape 22 attached to the back surface 25 of the lead frame array is separated from the lead frame array along a direction indicated by the arrow, thereby obtaining a packaged lead frame array.

FIG. 3B shows a partially enlarged view of a structure (semiconductor IC package) after the tape 22 is removed. As shown in FIG. 3B, the wires 18 and the semiconductor chips 14 mounted on the lead frame 10 and the lead frame 10 itself are covered with the mold compound 38, while the back surface 25 of the lead frame 10 is uncovered with the mold compound, and the clearances 11 between the leads 20, between the die pads 16 and/or between the leads 20 and the die pads 16 of the lead frame 10 are filled with the mold compound 38. As a result of the packaging method of the present invention, the mold compound 38 filled in the clearances 11 is recessed from the back surface 25 of the lead frame and a recessed mold compound surface 50 is presented.

Thereafter, a dicing/cutting process is performed as required, thereby obtaining individual semiconductor IC packages. The effects resulting from the packaging method of the present invention are described below by way of overcomes of experiment.

Figure 4A:
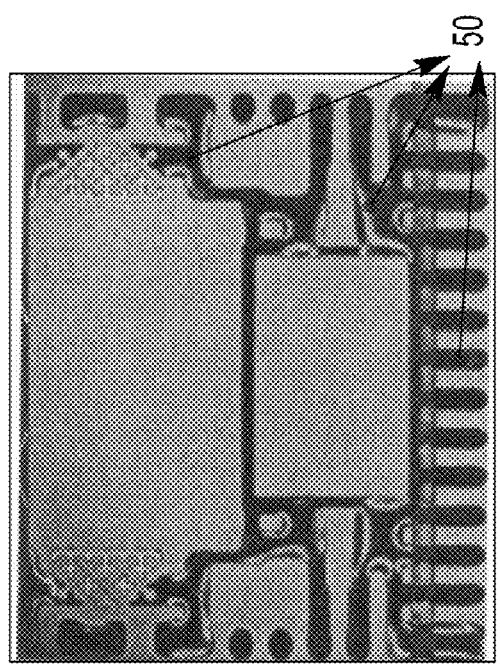

FIG. 4A shows a bottom surface (the back surface 25 of the lead frame) of a semiconductor IC package that was packaged using the method of the present invention, and FIG. 4B shows a bottom surface (the back surface 15 of the lead frame) of a semiconductor IC package that was packaged using a conventional method.

It can be seen by comparing FIGS. 4A and 4B that the mold compound surface in FIG. 4A is recessed at the clearances and the recessed mold compound surface 50 is bright because it reflects light. In contrast, FIG. 4B has no bright lines, since the mold compound surface at the clearances is planar and has the same height as that of the back surface 15.

It is found from measurements that, in this example, the back surface 25 obtained according to the present invention has an average recessed depth of 1.32 mil, a minimum recessed depth of 0.89 mil, and a stand deviation of 0.28 mil. However, the back surface 15 obtained according to the prior art has no recess.

According to the aforementioned experimental results, it is believed that the mold compound filled in the clearances is substantially not recessed from the back surface of the lead frame, in the semiconductor IC package obtained using the conventional mold compound packaging method, whereas in the semiconductor IC package obtained using the mold compound packaging method according to the present invention, the mold compound filled in the clearances is remarkably recessed inward so that the leads (and/or the die pads) are projected with respect to the mold compound in its periphery, i.e., the lead standoff is increased indirectly.

The present invention has been described in detail with reference to the drawings and the embodiments, but those skilled in the art should understand that, various modifications, alterations and adjustments of the present invention may be made without departing from the spirit and scope thereof.

The invention claimed is:

1. A method of packaging a semiconductor integrated circuit, comprising:
   providing a lead frame array having a front surface and a back surface opposite to said front surface, each lead frame in said lead frame array including leads and die pads, and on the front surface of said lead frame array, semiconductor chips are attached to corresponding die pads respectively, and pads on said semiconductor chips and corresponding leads of said lead frame are connected by wires;
   attaching a tape to the back surface of said lead frame array;
   holding said lead frame array between an upper mold chase and a lower mold chase of a mold, with the back surface of said lead frame array upward, said upper mold chase and said lower mold chase forming an upper cavity and a lower cavity with respect to said lead frame array respectively;
   injecting a mold compound into said upper cavity and said lower cavity respectively, wherein with respect to clearances between the leads, between the die pads and/or between the leads and the die pads, the mold compound injected into said upper cavity covers the portion of said tape over said clearances before the mold compound injected into said lower cavity fills said clearances, so that said tape is depressed;
   curing the mould compound after the mold is filled with the mould compound, then removing the mold; and
   removing said tape from the back surface of said lead frame array.

2. The method according to claim 1, wherein injecting the mold compound into said lower cavity is realized by branching a portion of the mold compound injected into said upper cavity into said lower cavity.

3. The method according to claim 1, wherein a velocity of a flow of the mold compound injected into said upper cavity is greater than a velocity of a flow of the mold compound injected into said lower cavity.

4. The method according to claim 1, wherein the injection of the mold compound into said lower cavity is initiated after the injection of the mold compound into said upper cavity is initiated.

5. The method according to claim 4, wherein the injection of the mold compound into said lower cavity is initiated after the upper cavity is filled with the mold compound.

6. The method according to claim 1, wherein edge portions of said leads and/or said die pads are half-etched on the back surface of the lead frame array, such that said clearances have larger sizes on said back surface than on said front surface.

* * * * *